United States Patent
Yamazaki

[11] Patent Number: 6,015,724
[45] Date of Patent: Jan. 18, 2000

[54] MANUFACTURING METHOD OF A SEMICONDUCTOR DEVICE

[75] Inventor: Shunpei Yamazaki, Tokyo, Japan

[73] Assignee: Semiconductor Energy Laboratory Co., Kanagawa-ken, Japan

[21] Appl. No.: 08/743,169

[22] Filed: Nov. 4, 1996

[30] Foreign Application Priority Data

Nov. 2, 1995 [JP] Japan .................................. 7-310075

[51] Int. Cl.[7] .................................................. H01L 21/00
[52] U.S. Cl. ........................... 438/151; 438/156; 438/585
[58] Field of Search .................................. 205/123, 124, 205/213; 438/585, 151, 156

[56] References Cited

U.S. PATENT DOCUMENTS

| | | | |
|---|---|---|---|
| 4,465,561 | 8/1984 | Nguyen | 205/211 |
| 5,440,239 | 8/1995 | Zappella | 324/757 |
| 5,639,344 | 6/1997 | Konuma | 438/585 |
| 5,686,328 | 11/1997 | Zhang et al. | 437/41 |
| 5,736,434 | 4/1998 | Konuma et al. | 438/151 |

OTHER PUBLICATIONS

Wolf, Stanley "Silicon Processing For The VLSI Era vol. 2: Process Integration", Lattice Press, pp. 240–258, 1990.

*Primary Examiner*—John F. Niebling
*Assistant Examiner*—Michael S. Lebentritt
*Attorney, Agent, or Firm*—Fish & Richardson P.C.

[57] ABSTRACT

After a contact hole for an aluminum gate electrode is formed, a nickel film is formed by electroless plating, and coincidently, a natural oxide film formed on the gate electrode is removed by wet etching. This provides a reliable contact between the gate electrode and an external lead-out wiring line.

2 Claims, 7 Drawing Sheets

MANUFACTURING METHOD OF A SEMICONDUCTOR DEVICE

BACKGROUND OF THE INVENTION

1. Field of the Invention

The present invention relates to a technique of obtaining a wiring contact to an electrode or wiring line that is made only or mainly of aluminum.

2. Description of the Related Art

A thin-film transistor is known which is formed by a manufacturing process as shown in FIGS. 5A to 5D. This type of thin-film transistor, which is formed on a glass substrate, has a feature of a small off-current, which is very important when the thin-film transistor is used in an active matrix liquid crystal display device or other thin-film integrated circuits.

In the thin-film transistor of FIGS. 5A to 5D, the off-current characteristic is improved by forming electrical buffer regions called offset gate regions between the channel forming region and the source and drain regions. The configuration of FIGS. 5A to 5D is disclosed in Japanese Unexamined Patent Publication No. Hei. 4-360580, for instance.

The manufacturing process of a thin-film transistor shown in FIGS. 5A to 5D will be described below. First, a glass substrate 201 is prepared, and a silicon oxide film 202 is formed on the surface of the glass substrate 201 by sputtering or plasma CVD. The silicon oxide film 202 is an undercoat film to prevent diffusion of impurities etc. from the glass substrate 201. An amorphous silicon film is formed thereon by plasma CVD or low-pressure thermal CVD.

When necessary, the amorphous silicon film is crystallized into a crystalline silicon film by a heat treatment or laser light illumination. If it is permitted that a resulting thin-film transistor exhibits low-level performance, the amorphous silicon film may be used as it is.

Next, the amorphous silicon film is patterned into an active layer 203 of an intended thin-film transistor. Then, a silicon oxide film 204 to serve as a gate insulating film is formed by plasma CVD or sputtering. Further, a gate electrode 205 is formed by forming an aluminum film and then patterning it. The gate electrode 205 is called a first-layer wiring. (FIG. 5A)

Next, an anodic oxide film 206 is formed around the gate electrode 205 by performing anodization in an electrolyte with the gate electrode 205 used as the anode. The technique of forming the anodic oxide film 206 is important in the thin-film transistor manufacturing process of FIGS. 5A to 5D. (FIG. 5B)

Thereafter, to form source and drain regions, impurity ions (P (phosphorus) ions in this embodiment) are implanted by ion implantation or plasma doping as shown in FIG. 5C.

In this step, the gate electrode 205 and the anodic oxide film 206 surrounding it act as a mask, and hence impurity ions are not implanted into the region thereunder. On the other hand, impurity ions are implanted into regions 207 and 210, which become a source region and a drain region, respectively. Regions 208 where impurity ions are not implanted become offset gate regions. Further, a region 209 becomes a channel forming region.

Since the impurity ion implantation step of FIG. 5C is performed in a self-aligned manner, no cumbersome operation such as mask registration is not needed. For this reason, this manufacturing process is much superior in productivity and can provide very small variations in characteristics among devices produced.

After the ion implantation step of FIG. 5C, a silicon oxide film 211 is formed as an interlayer insulating film. Further, contact holes are formed, and then a source electrode 212 and a drain electrode 213 are formed. At the same time, a lead-out electrode 214 extending from the gate electrode 205 is formed. (FIG. 5D)

Although FIG. 5D is drawn as if the source and drain electrodes 212 and 213 and the lead-out electrode 214 extending from the gate electrode 205 were located in the same vertical cross-section, actually the lead-out electrode 214 exists on the viewer—s side or the opposite side in FIG. 5D. The source and drain electrodes 212 and 213 and the lead-out electrode 214 are called a second-layer wiring.

The manufacturing process of FIGS. 5A to 5D is superior in the step of forming the offset gate regions and a resulting thin-film transistor has superior performance. In manufacture of a large-area active matrix liquid crystal display device and other large-scale integrated circuits, the use of aluminum in forming the gate electrode is very effective in reducing the wiring resistance.

Further, the configuration of FIGS. 5A to 5D is also advantageous in that since the gate electrode and the gate wiring line are covered with the dense anodic oxide film having a high breakdown voltage, great improvement is attained in terms of the leak to and the interaction with various wiring lines formed on the interlayer insulating film.

Although the thin-film manufacturing process of FIG. 5A to 5D is very advantageous as described above, there is a serious problem in the step of FIG. 5D. In the step of FIG. 5D, the contact holes for the source and drain electrodes 212 and 213 as well as the contact hole for the lead-out electrode 214 of the gate electrode 205 should be formed.

The contact holes for the source and drain electrodes 212 and 213 can be formed relatively easily through wet etching with a hydrofluoric acid type etchant such as a buffered hydrofluoric acid (BHF) because the films to be etched are the silicon oxide films 211 and 204.

Since the etching rate of the buffered hydrofluoric acid with respect to silicon is much smaller than that with respect to silicon oxide, the etching can be stopped at a time point when the etching has reached the active layer 203. That is, the active layer 203 can be used as an etching stopper.

In the case of forming the contact hole for the lead-out electrode 214, the silicon oxide film 211 and the aluminum oxide film 206 (mainly made of $Al_2O_3$) that was formed by anodization need to be etched. This etching is performed also by using a buffered hydrofluoric acid.

FIGS. 6A and 6B show how the oxide film 206 is etched with a hydrofluoric acid type etchant. First, as shown in FIG. 6A, the silicon oxide film 211 is etched with a hydrofluoric acid type etchant such as a buffered hydrofluoric acid. Then, the aluminum oxide film 206 is etched.

However, when the aluminum gate electrode 205 is exposed, a very thin oxide layer 302 is formed on its surface. The oxide layer 302 will prevent formation of a proper electrical contact in a later step.

Since the very thin oxide layer 302 is formed very easily due to exposure to the air, it is very difficult to prevent its formation.

In summary, the use of the aluminum gate electrode has the following advantages:

(1) A device suitable for high-speed operation can be formed because the electrode resistance can be reduced. In particular, where a gate wiring line is so formed as to extend from the gate electrode, its wiring resistance can be reduced.

(2) Offset gate regions can be formed in a self-aligned manner by an ion implantation process by using, as a mask, an aluminum oxide layer formed around the gate electrode.

(3) The possibility of occurrence of short-circuiting and crosstalk between upper and lower wiring lines can be reduced, contributing to increasing the reliability.

On the other hand, there is a problem that in forming a contact hole to reach the aluminum gate electrode, an oxide layer that is formed on the aluminum surface prevents formation of a proper contact. In particular, this problem is more serious in a case where a contact is to be taken between aluminum films.

SUMMARY OF THE INVENTION

An object of the present invention is to solve the above problem, that is, to solve the problem that a contact failure occurs due to the existence of an oxide film, which problem arises in the case where aluminum is used to form an electrode or a wiring line.

According to a first aspect of the invention, there is provided a manufacturing method of a semiconductor device, comprising the steps of eliminating an oxide film formed on a surface of a member only or mainly made of aluminum by cleaning in a solution containing ions of a metal; and at the same time, forming a film of the metal on the surface.

According to a second aspect of the invention, there is provided a manufacturing method of a semiconductor device, comprising the steps of forming a gate electrode with aluminum or a material mainly made of aluminum; forming an insulating film so that it covers the gate electrode; forming a contact hole through the insulating film to expose a portion of a surface of the gate electrode; and forming a film of a metal on the exposed surface portion of the gate electrode by using a solution containing ions of the metal.

In the above manufacturing method, it is effective to further provide the step of eliminating an oxide film formed on the exposed surface portion of the gate electrode coincidently with the formation of the metal film, the solution containing a component for eliminating the oxide film.

According to a third aspect of the invention, there is provided a manufacturing method of a semiconductor device, comprising the step of connecting a first member made only or mainly of aluminum with a second member made only or mainly of aluminum through a metal film precipitated on a surface of the first member.

According to a fourth aspect of the invention, there is provided a manufacturing method of a semiconductor device, comprising the step of connecting a first member made only or mainly of aluminum with a second member made of a first metal material through a metal film made of a second metal material which is precipitated on a surface of the first member.

According to a fifth aspect of the invention, there is provided a manufacturing method of a semiconductor device, comprising the steps of forming a metal film on a surface made only or mainly of aluminum;

eliminating the metal film by an etchant containing a halogen element, while terminating the surface made only or mainly of aluminum by the halogen element; and forming a contact comprising a conductive material on the surface. The state where the surface of an aluminum film is terminated by a halogen element is confirmed in FIGS. 8A and 8B.

FIGS. 8A and 8B show results of Auger analyses. FIG. 8A shows an analysis result of an aluminum film after eliminating, by chromic mixture acid, an anodic oxide film formed on a surface of the aluminum film. As can be seen in FIG. 8A, the analysis result indicates a chromium (Cr) peak.

On the other hand, FIG. 8B shows an analysis results of a surface of an aluminum film in a state where a passive state film formed on a surface of the aluminum film is eliminated by a 1% hydrofluoric acid after eliminating an anodic oxide film by a chromic mixture acid. As can be seen in FIG. 8B, a chromium peak disappears and instead fluorine (F) peak appears.

This is construes as indicating that the surface of the aluminum film is terminated by fluorine in the hydrofluoric acid treatment.

In the above manufacturing method, it is preferred that the metal film be precipitated coincidently with elimination of an oxide film formed on the surface of the first member.

In the invention, it is preferred that the metal film be formed by electroless plating.

In case of forming a contact to an aluminum, by lightly etching a surface to form a contact on by using an etchant, typically a hydrofluoric acid, the exposed surface of the aluminum can be terminated by a halogen element.

This can suppress formation of an oxide film on a surface of aluminum, to thereby be able to form an excellent ohmic contact in the subsequent contact formation. It should be noted that because the halogen element is removed when forming the contact, the existence of the halogen element does not adversely affect the contact formation.

Influences of a natural oxide film that is formed on an aluminum surface can be eliminated by forming a nickel film on the aluminum surface by electroless plating. In particular, adverse effects of the natural oxide film formed on the aluminum surface can be eliminated by performing the electroless plating during a cleaning step for eliminating the natural oxide film. As a result, a reliable electrical contact can be obtained between aluminum members, or between an aluminum member and a member of another metal or a conductor, or even a semiconductor.

DETAILED DESCRIPTION OF THE PREFERRED EMBODIMENTS

Embodiment 1

This embodiment is directed to a process for forming a thin-film transistor having a low off-current characteristic on a glass substrate. FIGS. 1A to 1E, 2A to 2D, and 3 show a manufacturing process of a thin-film transistor according to this embodiment.

Figure 1A:
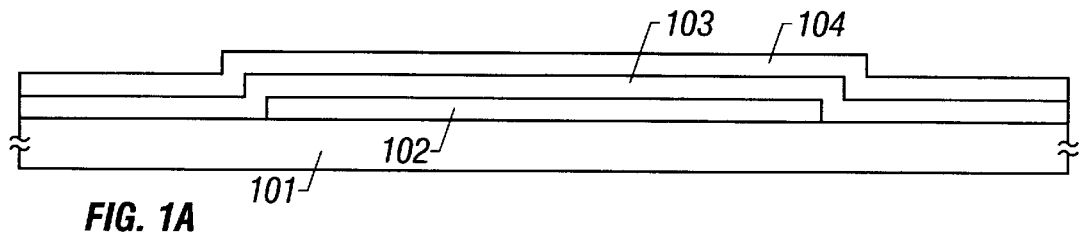
FIGS. 1A to 1E, 2A to 2D, and 3 schematically show a manufacturing process of a thin-film transistor according to a first embodiment of the present invention.

First, as shown in FIG. 1A, a 2,000-Å-thick silicon oxide film 102 as an undercoat film is formed on a glass substrate 101 by sputtering or plasma CVD. A quartz substrate may be used in place of the glass substrate 101, though this configuration is expensive.

Then, a 500-Å-thick amorphous silicon film is formed by plasma CVD or low-pressure thermal CVD. The low-pressure thermal CVD is preferred because it can provide better film quality.

Thereafter, the amorphous silicon film is crystallized by a heat treatment or laser light illumination, or their combination, to obtain a crystalline silicon film. The crystalline silicon film is then patterned into an island-like region 103, which will become the active layer of a thin-film transistor.

Then, a 1,000-Å-thick silicon oxide film to constitute a gate insulating film 104 is formed by sputtering or plasma CVD. Thus, the state of FIG. 1A is obtained.

Figure 1B:
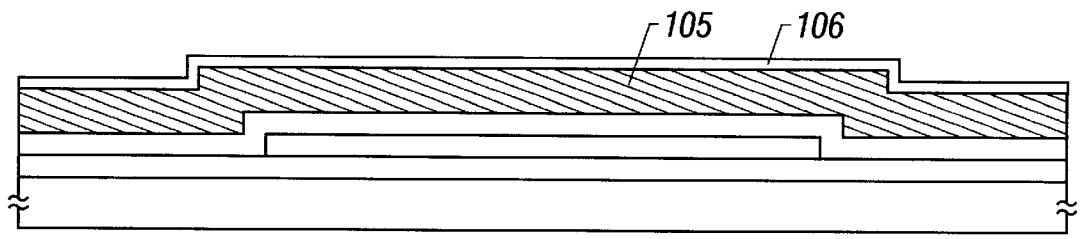

Next, as shown in FIG. 1B, a 5,000-Å-thick aluminum film 105 is formed by sputtering. To suppress occurrence of hillocks and whiskers in subsequent steps, scandium is added to the aluminum film 105 at 0.1 wt %. Hillocks and whiskers are prickle-like or needle-like protrusions caused by abnormal growth of aluminum.

Then, a dense anodic oxide film 106 is formed on the surface of the aluminum film 105 by anodization in an electrolyte that is obtained by neutralizing an ethylene glycol solution containing tartaric acid at 3% with ammonia. The aluminum film 105 is used as the anode.

The anodic oxide film 106 is dense in film quality, and will serve to improve adhesiveness to a resist mask (formed later). The thickness of the anodic oxide film 106 may be set at about 100 Å. The thickness can be controlled by the application voltage.

Figure 1C:
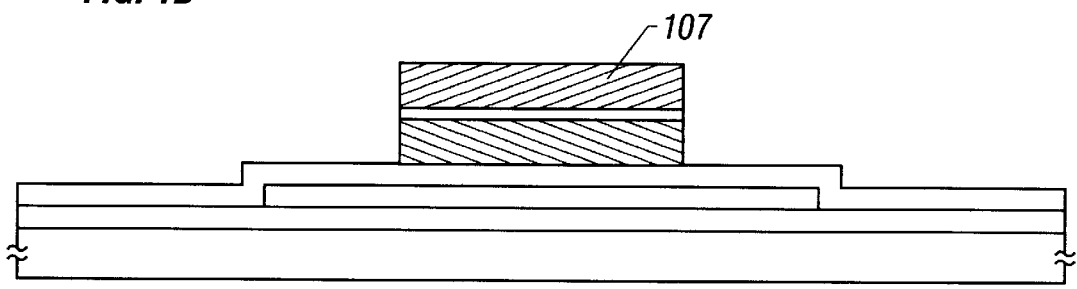

Next, as shown in FIG. 1C, the aluminum film 105 and the anodic oxide film 106 formed thereon are etched by using a resist mask 107.

Figure 1D:
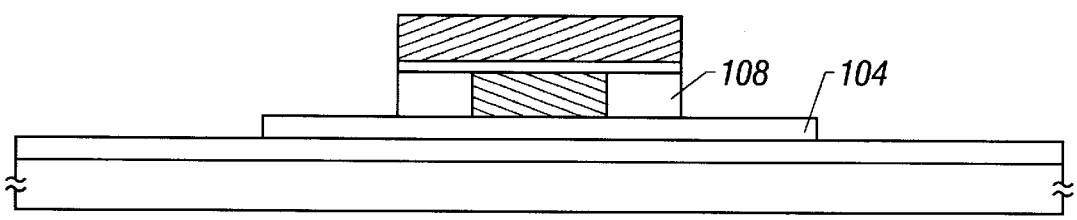

After the state of FIG. 1C is obtained, anodization is again performed in a 3% oxalic acid aqueous solution. In this anodization step, porous anodic oxide films 108 are formed in a manner shown in FIG. 1D because of the existence of the resist mask 107 and the dense anodic oxide film 106. Thus, the state of FIG. 1D is obtained.

The growth length of the porous anodic oxide films 108 is set at 5,000 Å. The growth length, i.e., the thickness of the porous anodic oxide films 108 can be controlled by the anodization time.

Thereafter, the resist mask 107 and the dense anodic oxide film 106 are removed. Then, anodization is again performed in an electrolyte that is obtained by neutralizing an ethylene glycol solution containing tartaric acid at 3% with ammonia.

Figure 1E:
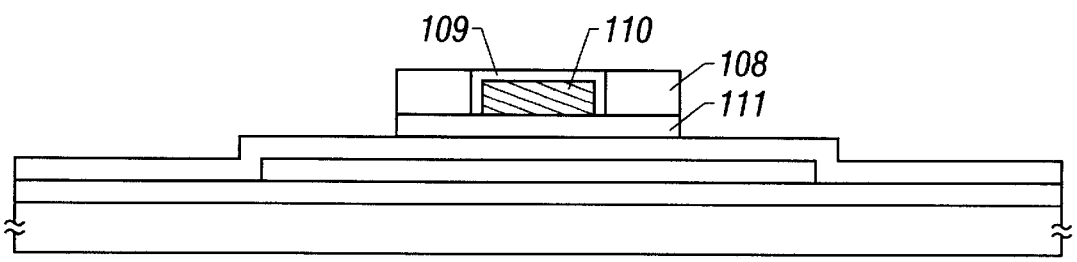

In this anodization step, a dense anodic oxide film 109 is formed in such a manner shown in FIG. 1E because the electrolyte permeates the porous anodic oxide films 108. The thickness of the dense anodic oxide film 109 is set at 600 Å.

Thus, the state of FIG. 1E is obtained. In this state, an aluminum gate electrode 110 is defined. Although not apparent from FIG. 1E, a gate wiring line is formed at the same time so as to extend from the gate electrode 110.

By forming an electrode and a wiring line with aluminum as in the above case, their resistance can be set low. This is very effective in the case where it is necessary to form a fine circuit in a large area as in the case of an active matrix liquid crystal display device.

Next, the exposed portions of the gate insulating film (silicon oxide film) 104 is removed to obtain a residual gate insulating film 111.

To etch the silicon oxide film 104, there may be used a hydrofluoric acid type etchant such as hydrofluoric acid, a buffered hydrofluoric acid (BHF), or hydrofluoric acid or a buffered hydrofluoric acid added with acetic acid. A further example is an etchant obtained by adding a surfactant to one of the above hydrofluoric acid type etchant.

The buffered hydrofluoric acid may be obtained by mixing ammonium fluoride and hydrofluoric acid at a ratio of 10:1. The etching rate of the above hydrofluoric acid type etchants with respect to silicon oxide and aluminum is much larger than that with respect to silicon. Therefore, they are useful in selectively removing a member made only or mainly of silicon oxide or aluminum, or forming a contact hole therethrough.

Alternatively, the silicon oxide film 104 may be etched by dry etching using a fluorine type gas such as a $CF_4$ gas or a $CHF_3$ gas.

Thus, the state of FIG. 1E is obtained. Next, the porous anodic oxide films 108 are removed (see FIG. 2A).

In this state, impurity ions are implanted to impart n-type or p-type conductivity to the crystalline silicon film 103. In this embodiment, P (phosphorus) ions are implanted to produce an n-channel thin-film transistor.

In this step, impurity ions are implanted at a high concentration into regions 112 and 116 and at a low concentration into regions 113 and 115, because the residual gate insulating film 111 serves as a semi-transparent mask. Impurity ions are not implanted into a region 114, which is thereby defined as a channel forming region.

Then, laser light illumination is performed to activate and anneal the regions where impurity ions have been implanted.

As a result, a source region 112, a drain region 116, low-concentration impurity regions 113 and 115, and a channel forming region 114 are formed. The low-concentration impurity region 115 is called a LDD (lightly doped drain) region.

Figure 2A:
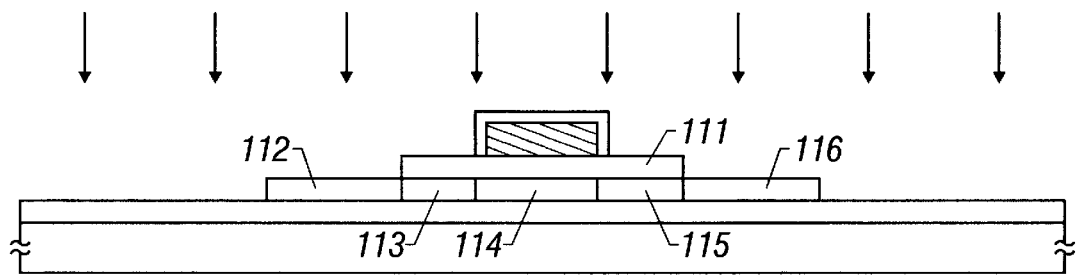
Figure 2B:
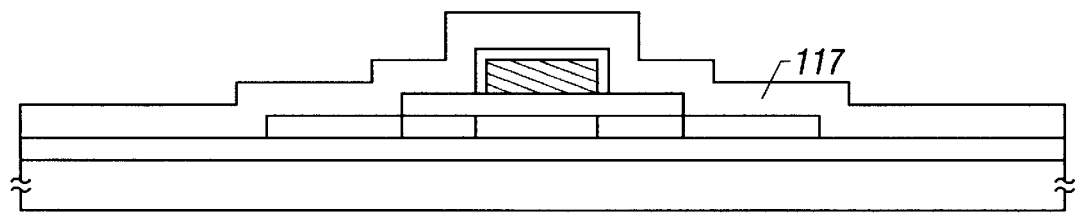

Next, as shown in FIG. 2B, a silicon oxide film is formed by plasma CVD as an interlayer insulating film 117.

Figure 2C:
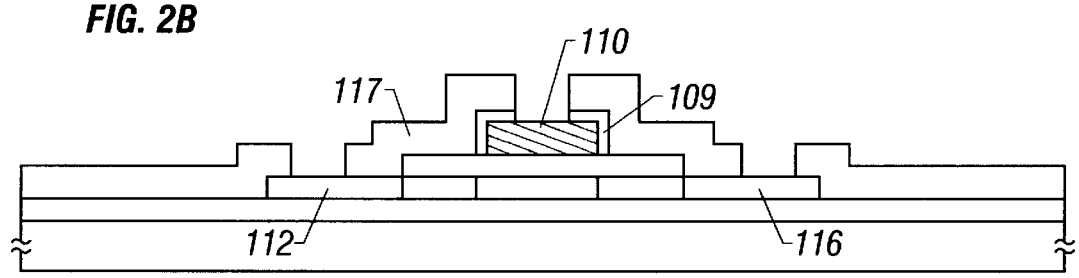

Next, as shown in FIG. 2C, contact holes are formed for the source region 112, the drain region 116, and the gate electrode 110 (or the gate wiring line extending therefrom).

In this step, first the interlayer insulating film 117 is etched with a buffered hydrofluoric acid, and then the dense anodic oxide film 109 is etched by dry etching using a HBr gas and methanol. (FIG. 2C)

Further, a nickel film is formed by electroless plating. In this embodiment, a nickel film is formed on the surface of the aluminum gate electrode 110 by performing electroless plating coincidently with a wet treatment that is performed after the dry etching. The wet treatment also serves as a step of removing a natural oxide film that is formed on the exposed surface of the aluminum gate electrode 110.

Figure 2D:
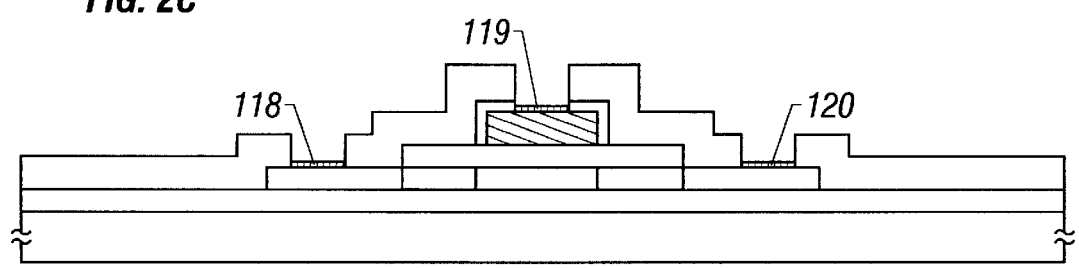

Electroless plating enables selective formation of a nickel film on an aluminum surface. Therefore, as shown in FIG. 2D, nickel films 118 to 120 can be formed selectively. A typical thickness of the nickel films 118 to 120 is 10 to 100 Å.

The formation of the nickel films 118 to 120 by electroless plating is performed coincidently with the elimination of a very thin oxide film (natural oxide film) that is unavoidably formed on the surface of the aluminum gate electrode 110. Since influences of a natural oxide film formed on the surface of a nickel film are generally negligible, the finally obtained contact becomes reliable.

Figure 3:
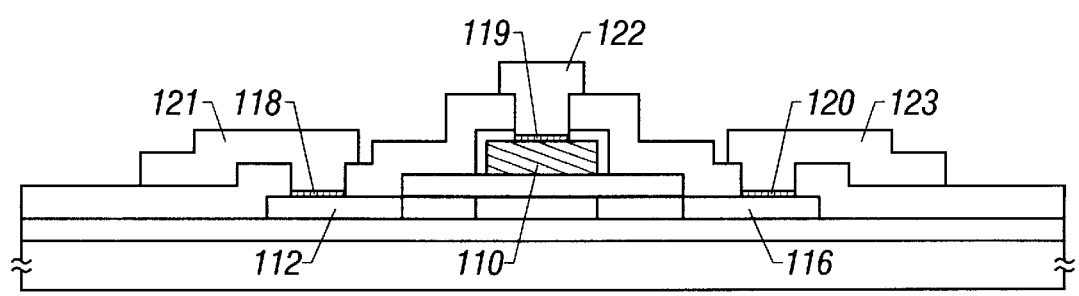

Next, an aluminum electrode (wiring line) 122 is formed as shown in FIG. 3. Since the nickel film 119 has been precipitated on the surface of the aluminum gate electrode 110 by electroless plating, a superior contact can be obtained between the aluminum gate electrode 110 and the aluminum lead-out electrode 122.

On the other hand, reference numeral 121 and 123 denote a source electrode (source wiring line) and a drain electrode (drain wiring line), respectively. Contacts between these electrodes and the source and drain regions, 112 and 116 are taken through nickel films 118 and 120, respectively. The insertion of the nickel films 118 and 120 does not influence the operation of the thin-film transistor at all.

Although the lead-out electrodes 121 to 123 are made of aluminum in this embodiment, they may be a multi-layer film consisting of a first titanium film, an aluminum film, and a second titanium film to obtain better contact performance. Even in this case, the superior contact between the aluminum gate electrode 110 and the lead-out electrode 122 due to the existence of the nickel film 119 can be maintained.

Embodiment 2

This embodiment is directed to a case of forming a thin-film transistor having a configuration similar to that of the first embodiment in a pixel region of an active matrix liquid crystal display device.

First, a thin-film transistor is formed according to the same manufacturing steps (up to the FIG. 2B step) as in the first embodiment.

Figure 4A:
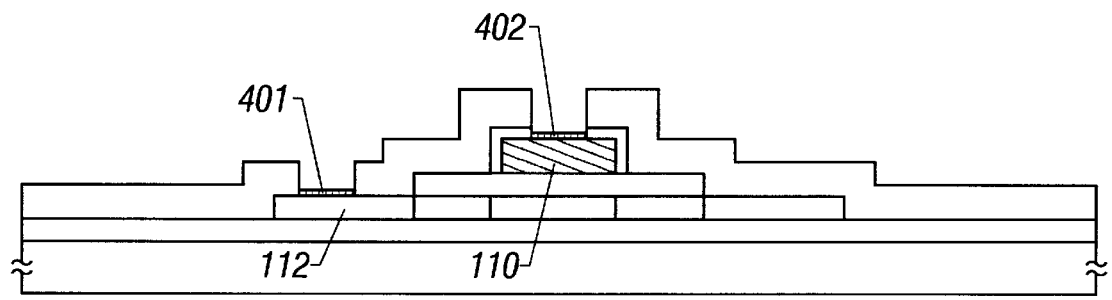
FIGS. 4A to 4D schematically show a manufacturing process of a thin-film transistor according to a second embodiment of the invention.

Next, as shown in FIG. 4A, contact holes for the source region 112 and the gate electrode 110 are formed, and nickel films 401 and 402 are formed by electroless plating.

Figure 4B:
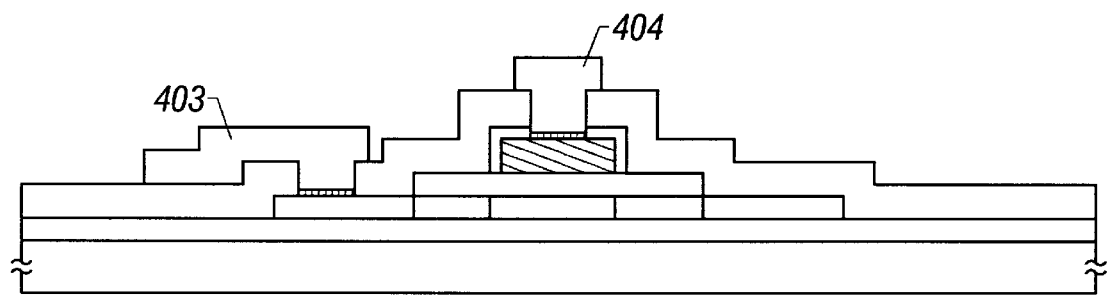

Then, aluminum lead-out electrodes 403 and 404 are formed as shown in FIG. 4B. By virtue of the existence of the nickel film 402, a superior contact can be obtained between the aluminum lead-out electrode 404 and the aluminum gate electrode 110.

Thereafter, a second interlayer insulating film 405 is formed by using a transparent resin material such as an acrylic resin or polyimide.

The second interlayer insulating film 405 is made as thick as several micrometers. Being made of a resin material, the surface of the second interlayer insulating film 405 can be made flat. This is important in a configuration that a liquid crystal layer will be provided on the second interlayer insulating film 405.

Figure 4C:
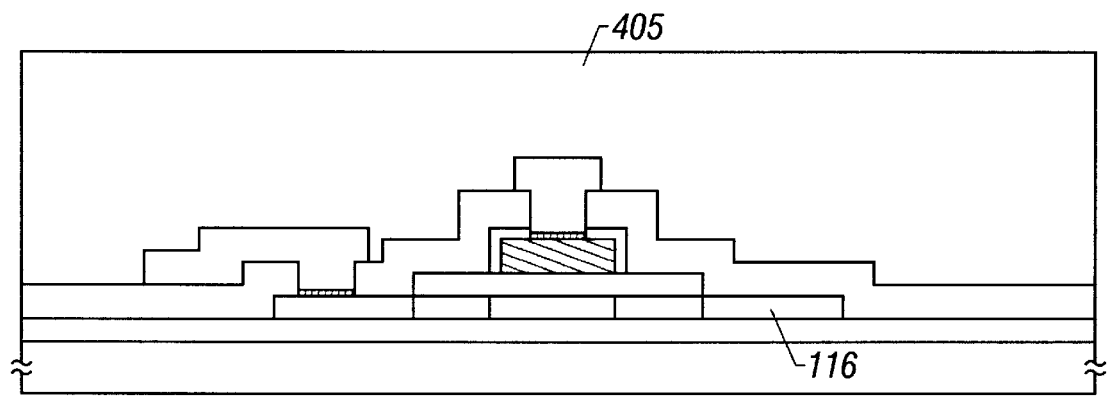
Figure 4D:
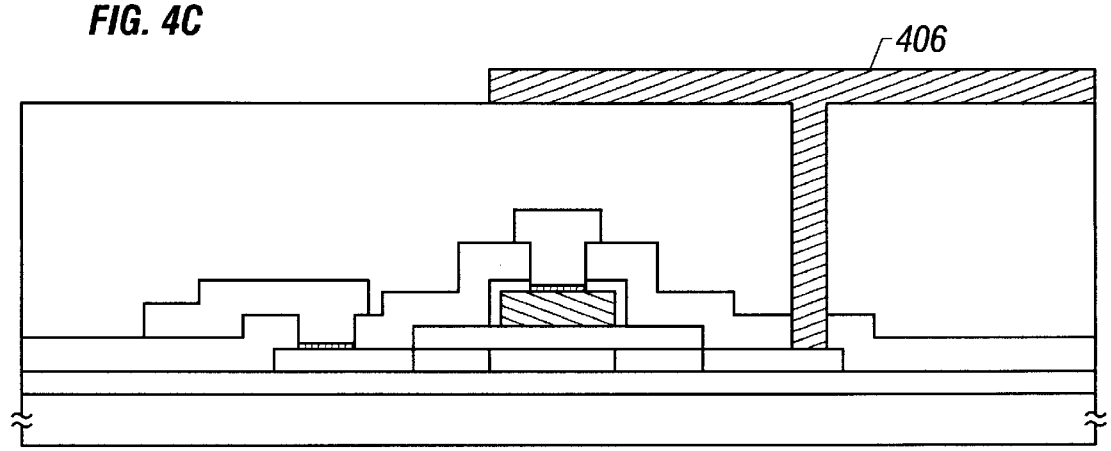
Figure 5A:
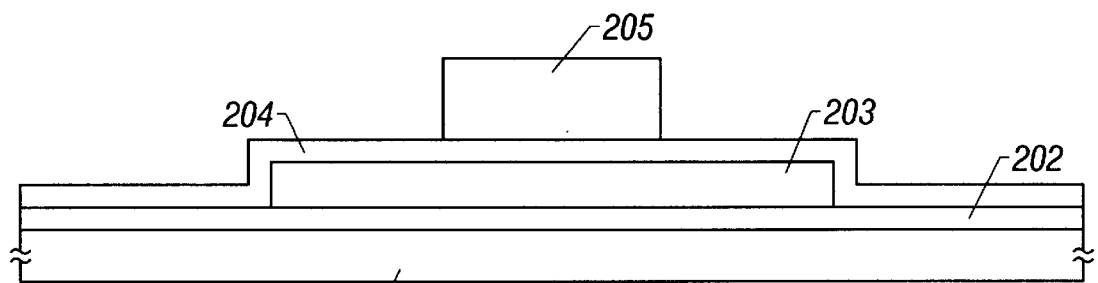
FIGS. 5A to 5D show a conventional manufacturing process of a thin-film transistor.
Figure 5B:
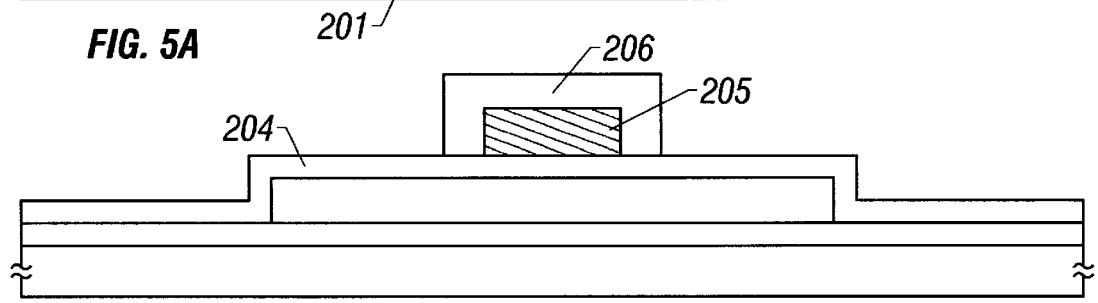
Figure 5C:
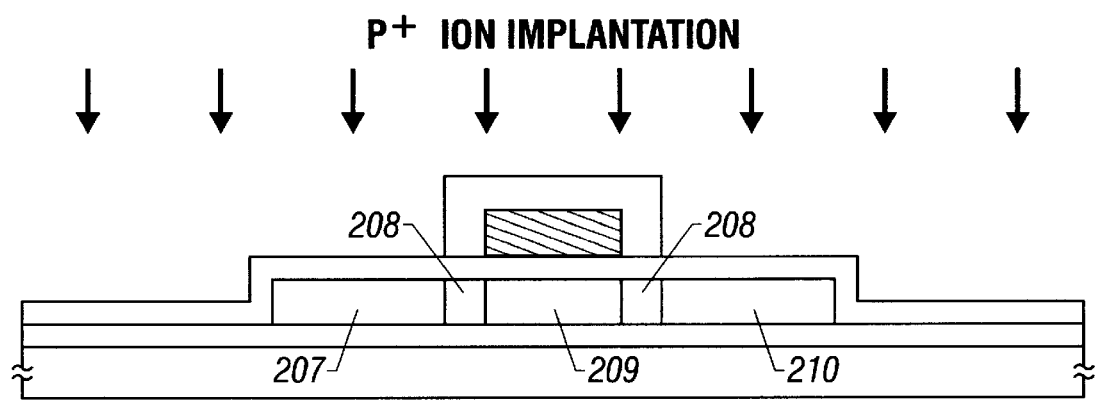
Figure 5D:
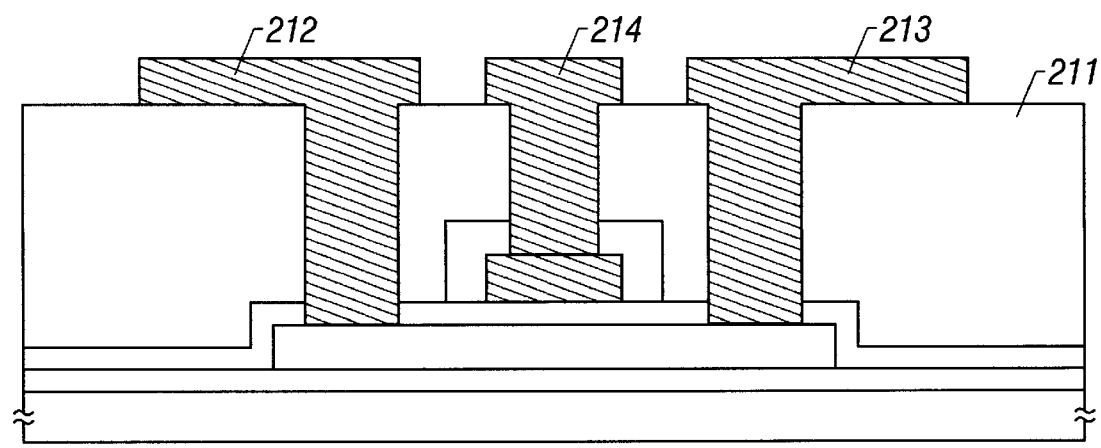
Figure 6A:
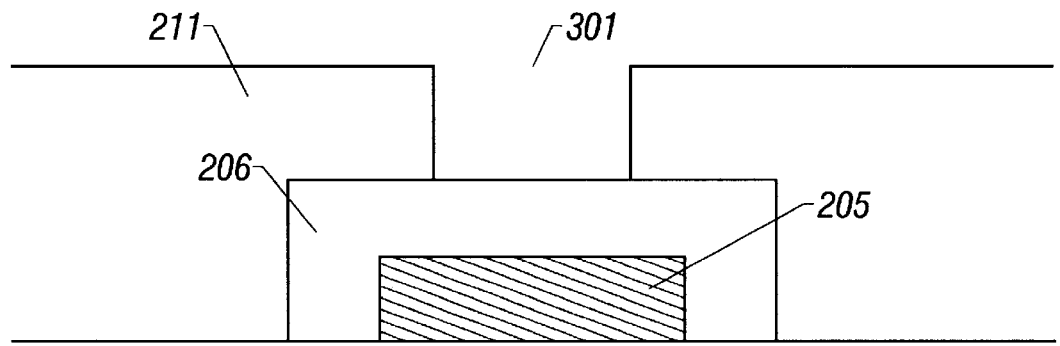
FIGS. 6A and 6B show how a contact to a gate electrode is obtained.
Figure 6B:
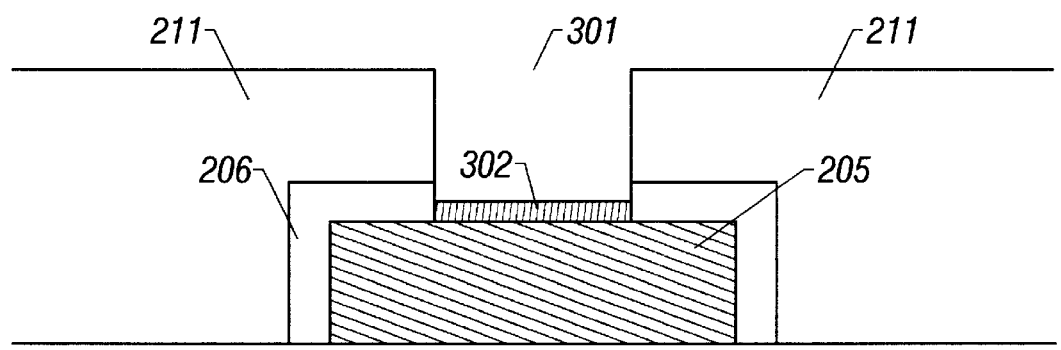

Thus, the state of FIG. 4C is obtained. Thereafter, a contact hole for the drain region 116 is formed, and then an ITO pixel electrode 406 is formed.

The pixel electrode 406 is so patterned as to cover the thin-film transistor. Although this structure is generally unfavorable because of addition of an undesired capacitance, this problem can be avoided by making the second interlayer insulating film 405 thicker than about several micrometers.

Even in the configuration of this embodiment, a reliable contact can be obtained between the gate electrode 110 and the lead-out electrode 404 both of which are made of aluminum.

Embodiment 3

Figure 7A:
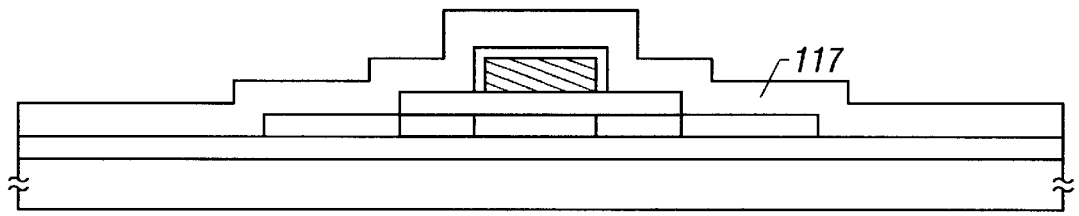
FIGS. 7A to 7D schematically show a manufacturing process of a thin-film transistor according to a third embodiment of the present invention.

A contact for a gate electrode comprising aluminum is obtained in this Embodiment 3 in a method different from those of the other embodiments. FIGS. 7A to 7D show a manufacturing process according to this Embodiment 3. At first, a structure shown in FIG. 7A is obtained according to manufacturing steps shown in FIGS. 1A to 1E and 2A to 2D. A manufacturing step for each part is the same as in FIGS. 1A to 1E and 2A to 2D unless described below.

A silicon oxide film 117 is formed as an interlayer insulating film as shown in FIG. 7A.

After the process step of FIG. 7A, openings (holes) 701, 702 and 703 for contacts are formed by dry etching. The opening 701 for a source region and the opening 703 for a drain region are then formed. Also, the opening for a gate electrode exposes an anodic oxide film 109.

Figure 7B:
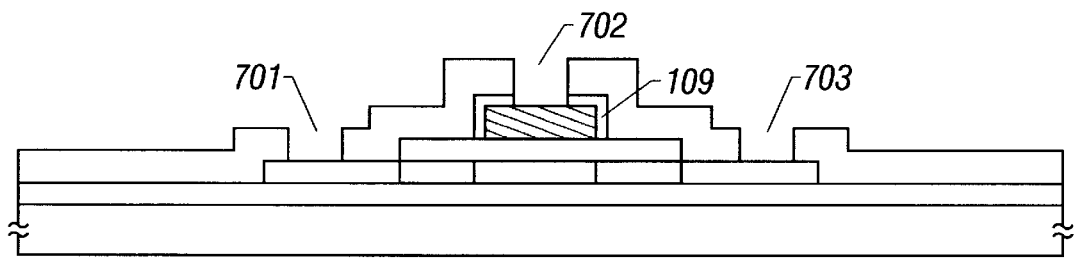

A structure shown in FIG. 7B is then obtained. Then, the anodic oxide film 109 is removed using a chromic mixture acid. The chromic mixture acid is a solution obtained by mixing an acetic acid, a nitric acid, a phosphoric acid, a water, and a chromic acid aqueous solution. The chromic mixture acid has a function of selectively removing an oxide of aluminum.

When the anodic oxide film 109 is removed using a chromic mixture acid, a chromium film (an extremely thin film) is formed on a surface of the aluminum film. In addition, a passive state film is formed at the same time. Specifically, a passive state film is formed on a surface of the aluminum film, and further a chromium film is formed thereon.

Figure 7C:
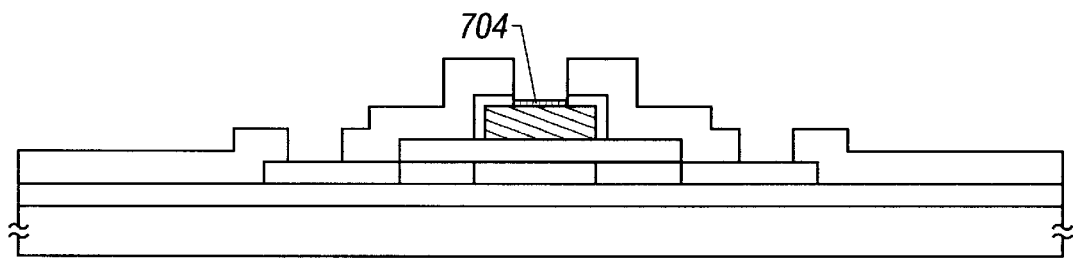
Figure 7D:
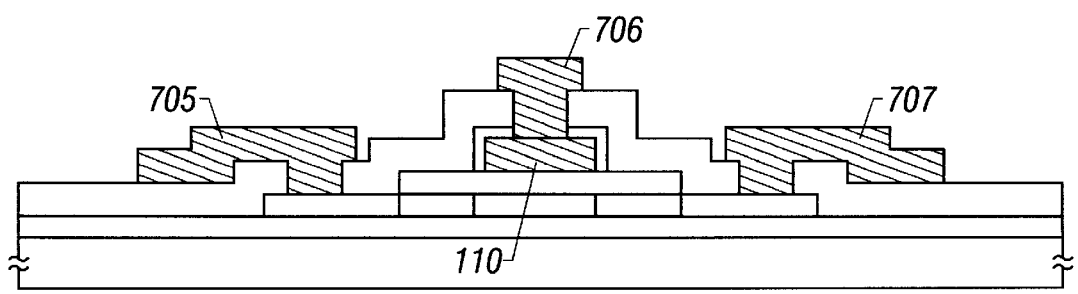
Figure 8A:
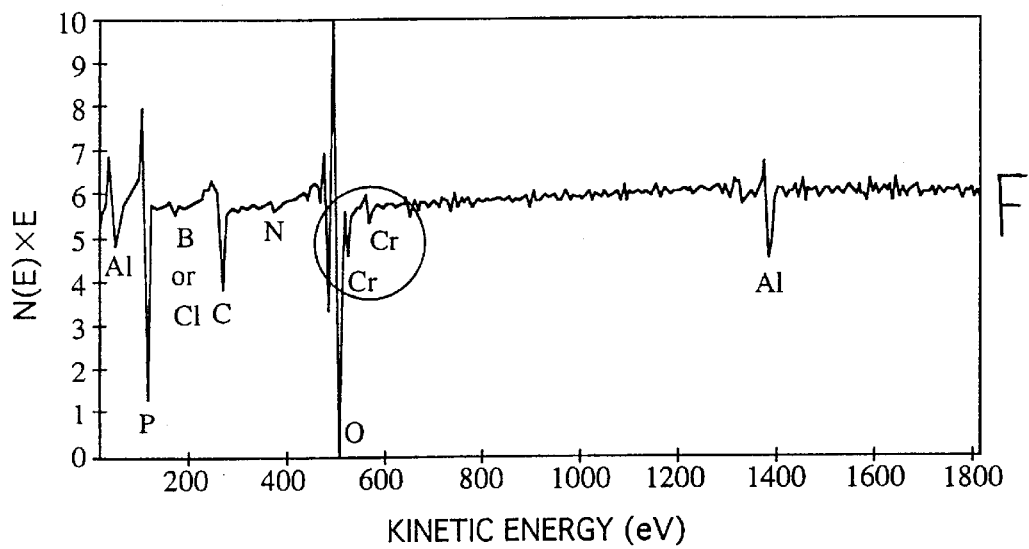
FIGS. 8A and 8B show Auger analyses of surfaces of aluminum films
Figure 8B:
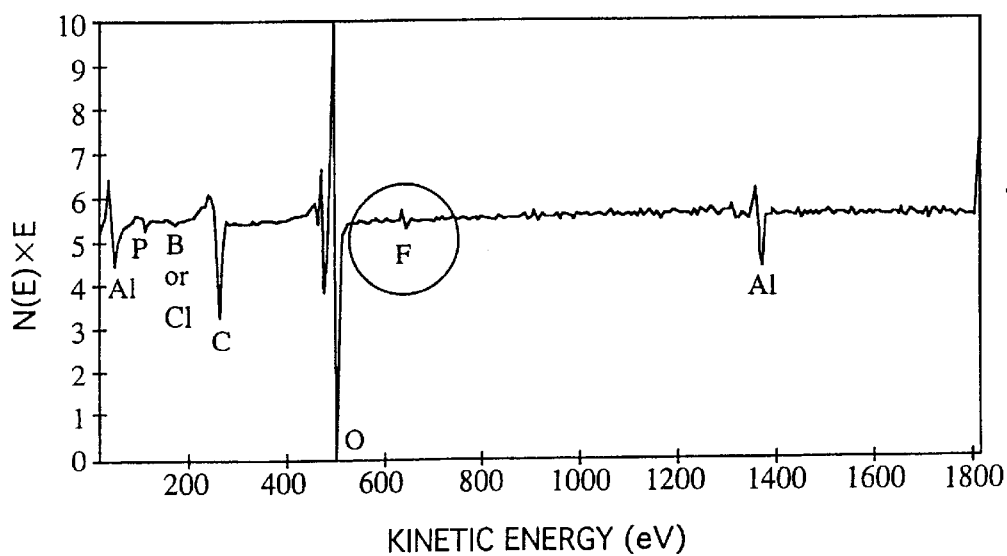

Typically, this film is shown in FIG. 7C by a reference numeral 704. Under this state, the passive state film is removed by a hydrofluoric acid. The chromium film is removed at the same time. A surface of the aluminum film is terminated by a fluorine atom. The same effect can be obtained in case of using other halogen elements such as chlorine.

After removing the passive state film, electrodes 705, 706, and 707 each made of a multi-layer comprising a titanium film, an aluminum film and another titanium film are formed. Because an exposed surface of a gate electrode 110 to become a contact is terminated by a fluorine atom, it can be suppressed to form an oxide film on the part. A contact between the electrode 706 and the gate electrode 110 can be made an excellent ohmic contact.

By utilizing the invention, the contact failure problem can be solved which would otherwise occur when wiring lines or electrodes are formed with aluminum.

Forming wiring lines or electrodes with aluminum is very effective in reducing their resistance. Its practicality is further enhanced by the above-mentioned advantages of the invention.

The invention is effective when applied to manufacture of a large-area active matrix liquid crystal display device or the like which requires low-resistance wiring lines and electrodes.

Although nickel is used in the foregoing, other metals can be used in place of nickel if the same effect is obtained therewith.

What is claimed is:

1. A manufacturing method of a semiconductor device comprising the steps of:

forming an anodic oxide film on a gate electrode comprising aluminum;

forming an interlayer insulating film over said anodic oxide film and said gate electrode;

forming an opening in said interlayer insulating film to expose a portion of said anodic oxide film;

removing the exposed portion of said anodic oxide film by a chromic mixture acid to deepen said opening toward said anodic oxide film and to allow a passive state film of said aluminum to be formed on a surface of a portion of said gate electrode under said opening; and removing said passive state film using a hydrofluoric acid to form a contact hole extending from said opening to said surface portion of said gate electrode and to terminate said surface of said portion of said gate electrode by a fluorine atom.

2. The method of claim 1 wherein said chromic mixture acid comprises an acetic acid, a nitric acid, a phosphoric acid and a chromic acid.

* * * * *